United States Patent
Cho et al.

(10) Patent No.: US 12,300,473 B2
(45) Date of Patent: May 13, 2025

(54) ELECTROSTATIC CHUCK FOR HIGH BIAS RADIO FREQUENCY (RF) POWER APPLICATION IN A PLASMA PROCESSING CHAMBER

(71) Applicant: APPLIED MATERIALS, INC., Santa Clara, CA (US)

(72) Inventors: Jaeyong Cho, San Jose, CA (US); Shahid Rauf, Pleasanton, CA (US); Peng Tian, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 609 days.

(21) Appl. No.: 16/406,921

(22) Filed: May 8, 2019

(65) Prior Publication Data
US 2020/0286717 A1 Sep. 10, 2020

Related U.S. Application Data

(60) Provisional application No. 62/815,919, filed on Mar. 8, 2019.

(51) Int. Cl.
*H01J 37/32* (2006.01)
*H01L 21/67* (2006.01)
*H01L 21/683* (2006.01)

(52) U.S. Cl.
CPC .... *H01J 37/32724* (2013.01); *H01L 21/6833* (2013.01); *H01J 2237/002* (2013.01); *H01J 2237/3341* (2013.01); *H01L 21/67069* (2013.01)

(58) Field of Classification Search
CPC ......... H01J 37/32724; H01J 2237/3341; H01J 2237/002; H01L 21/6833; H01L 21/6831; H02N 13/00
See application file for complete search history.

(56) References Cited

U.S. PATENT DOCUMENTS 5,607,541 A * 3/1997 Kubota ............... H01L 21/6831
156/538
5,625,526 A 4/1997 Watanabe et al.
(Continued)

FOREIGN PATENT DOCUMENTS

| JP | 2003338492 A | 11/2003 |
|---|---|---|
| JP | 2005268654 A | 9/2005 |
| WO | WO 2016/003599 A1 | 1/2016 |

OTHER PUBLICATIONS

Definition of "similar" from Cambride Dictionary available at https://dictionary.cambridge.org/us/dictionary/english/similar, 2 p, Accessed on Apr. 5, 2024. (Year: 2024).*

*Primary Examiner* — Keath T Chen
*Assistant Examiner* — Margaret Klunk
(74) *Attorney, Agent, or Firm* — Moser Taboada

(57) ABSTRACT

Embodiments of an electrostatic chuck are provided herein. In some embodiments, an electrostatic chuck for use in a substrate processing chamber includes a plate having a first side and a second side opposite the first side, a first electrode embedded in the plate proximate the first side, a second electrode embedded in the plate proximate the second side, a plurality of conductive elements coupling the first electrode to the second electrode, a first gas channel disposed within the plate and between the first electrode and the second electrode, a gas inlet extending from the second side of the plate to the first gas channel; and a plurality of gas outlets extending from the first side of the plate to the first gas channel.

17 Claims, 3 Drawing Sheets

(56) References Cited

U.S. PATENT DOCUMENTS

| | | | |
|---|---|---|---|
| 7,156,951 B1* | 1/2007 | Gao | H01L 21/67109 118/724 |
| 8,607,731 B2 | 12/2013 | Hoffman et al. | |
| 9,673,025 B2 | 6/2017 | Benjamin et al. | |
| 9,852,889 B1 | 12/2017 | Kellogg et al. | |
| 2002/0135969 A1 | 9/2002 | Weldon et al. | |
| 2004/0218339 A1* | 11/2004 | Nakamura | H01L 21/6831 361/234 |
| 2005/0211694 A1 | 9/2005 | Moroz | |
| 2009/0034147 A1* | 2/2009 | Narendrnath | H01L 21/6831 279/128 |
| 2009/0168292 A1* | 7/2009 | Watanabe | H01L 21/6831 361/234 |
| 2009/0314433 A1* | 12/2009 | Hoffman | H01L 21/6833 156/345.48 |
| 2010/0254064 A1* | 10/2010 | Miyashita | H02N 13/00 137/561 R |
| 2013/0021717 A1* | 1/2013 | Singh | H01L 21/6831 361/234 |
| 2013/0088809 A1* | 4/2013 | Parkhe | H01L 21/683 165/185 |
| 2014/0253900 A1 | 9/2014 | Cornelissen et al. | |
| 2015/0279714 A1 | 10/2015 | Yamaguchi et al. | |
| 2015/0348813 A1 | 12/2015 | Mangalore et al. | |
| 2015/0371885 A1 | 12/2015 | Tamagawa et al. | |
| 2016/0002778 A1* | 1/2016 | Ravi | C23C 16/4586 118/728 |
| 2017/0069519 A1* | 3/2017 | Shiraiwa | H01L 21/6831 |
| 2017/0110356 A1* | 4/2017 | Matyushkin | H01L 21/67109 |
| 2017/0117174 A1* | 4/2017 | Weichart | H01L 21/6831 |
| 2017/0263418 A1 | 9/2017 | Benjamin et al. | |
| 2017/0287680 A1 | 10/2017 | Benjamin et al. | |
| 2017/0287764 A1 | 10/2017 | Kouno et al. | |
| 2017/0352567 A1 | 12/2017 | Cho et al. | |
| 2018/0247852 A1 | 8/2018 | Shiraiwa | |
| 2018/0350561 A1* | 12/2018 | Yamaguchi | H01L 21/68785 |
| 2019/0088519 A1* | 3/2019 | Cho | H01J 37/32706 |

* cited by examiner

ELECTROSTATIC CHUCK FOR HIGH BIAS RADIO FREQUENCY (RF) POWER APPLICATION IN A PLASMA PROCESSING CHAMBER

CROSS-REFERENCE TO RELATED APPLICATIONS

This application claims benefit of U.S. provisional patent application Ser. No. 62/815,919, filed Mar. 8, 2019, which is herein incorporated by reference in its entirety.

FIELD

Embodiments of the present disclosure generally relate to substrate processing systems, and more specifically, to electrostatic chucks for use in substrate processing systems.

BACKGROUND

Radio frequency (RF) power is often used in etching processes, for example, requiring very high aspect ratio holes to make contacts or deep trenches for laying infrastructure for electrical pathways. RF power can be used for plasma generation and/or for creating bias voltage on a substrate being processed to attract ions from bulk plasma. An electrostatic chuck is used to electrostatically hold a substrate to control substrate temperature during processing. The electrostatic chuck typically includes an electrode embedded in a dielectric plate and a cooling plate disposed below the dielectric plate. An RF power source for creating bias is applied to the cooling plate. A backside gas may be introduced between the substrate and a top surface of the electrostatic chuck via gas channels in the electrostatic chuck as a heat transfer medium. However, the inventors have observed that RF power applied to the cooling plate to induce a bias voltage on the substrate creates a DC potential difference between the substrate and the cooling plate which can undesirably lead to arcing in the gas channels.

Accordingly, the inventors have provided an improved electrostatic chuck.

SUMMARY

Embodiments of an electrostatic chuck are provided herein. In some embodiments, an electrostatic chuck for use in a substrate processing chamber includes a plate having a first side and a second side opposite the first side; a first electrode embedded in the plate proximate the first side; a second electrode embedded in the plate proximate the second side; a plurality of conductive elements coupling the first electrode to the second electrode; a first gas channel disposed within the plate and between the first electrode and the second electrode; a gas inlet extending from the second side of the plate to the first gas channel; and a plurality of gas outlets extending from the first side of the plate to the first gas channel.

In some embodiments, an electrostatic chuck for use in a substrate processing chamber includes a plate having a first side and a second side opposite the first side; a first electrode embedded in the plate proximate the first side; a second electrode embedded in the plate proximate the second side; a third electrode embedded in a peripheral region of the plate, between the first electrode and the second electrode; and a plurality of first posts extending from the first electrode to the second electrode to electrically couple the first electrode and the second electrode; and a plurality of second posts extending from at least one of the first electrode or the second electrode to the third electrode to electrically couple the third electrode to the at least one of the first electrode or the second electrode.

In some embodiments, a process chamber includes a chamber body having a substrate support disposed within an inner volume of the chamber body, wherein the substrate support includes an electrostatic chuck comprising a cooling plate; a dielectric plate disposed above the cooling plate and having a first electrode, a second electrode, and a plurality of posts electrically coupling the first electrode to the second electrode; one or more first gas channels extending from a bottom surface of the electrostatic chuck into the dielectric plate; a plurality of second gas channels that extend from the one or more first gas channel horizontally across the electrostatic chuck between the first electrode and the second electrode; and a plurality of third gas channels extending from the plurality of second gas channels to a top surface of the electrostatic chuck.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
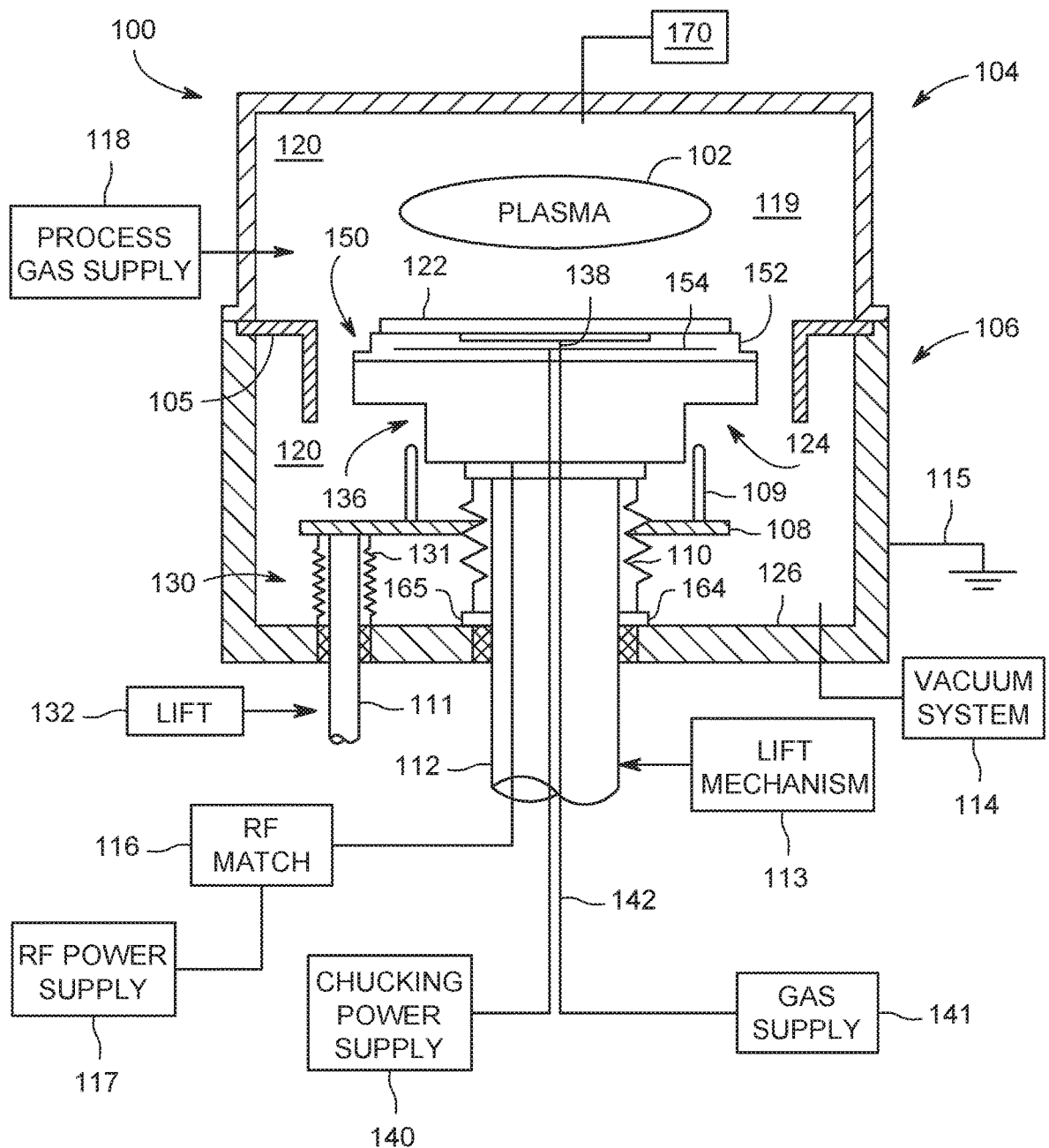
FIG. 1 depicts a schematic side view of a process chamber having an electrostatic chuck in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of electrostatic chucks for use in a substrate processing chamber are provided herein. The electrostatic chuck includes a dielectric plate having a support surface to support a substrate. The dielectric plate is disposed on a cooling plate. In some embodiments, one or more gas channels extend from a bottom surface of the electrostatic (e.g., bottom surface of the cooling plate) to a top surface of the electrostatic chuck (e.g., top surface of the dielectric plate). The one or more gas channels are configured to provide backside gas, such as nitrogen (N) or helium (He), to the top surface of the electrostatic chuck to act as a heat transfer medium.

In some embodiments, a RF power source is coupled to the cooling plate and configured to provide negative bias to a substrate being processed. As RF power is applied to the cooling plate, a peak-to-peak voltage (Vpp) on the cooling plate and Vpp on the substrate is different depending on the impedance of the dielectric plate. The difference in respective peak-to-peak voltages creates an electric field between the cooling plate and the substrate, which can undesirably cause backside gas to be ionized and consequently lead to arcing. In some embodiments, multiple electrodes are disposed in the dielectric plate to advantageously reduce the difference between the Vpp on the cooling plate and the Vpp on the substrate.

FIG. 1 is a schematic cross-sectional view of process chamber (e.g., a plasma processing chamber) in accordance with some embodiments of the present disclosure. In some embodiments, the plasma processing chamber is an etch processing chamber. However, other types of processing chambers configured for different processes can also use or be modified for use with embodiments of the electrostatic chuck described herein.

The chamber 100 is a vacuum chamber which is suitably adapted to maintain sub-atmospheric pressures within a chamber interior volume 120 during substrate processing. The chamber 100 includes a chamber body 106 covered by a lid 104 which encloses a processing volume 119 located in the upper half of chamber interior volume 120. The chamber 100 may also include one or more shields 105 circumscribing various chamber components to prevent unwanted reaction between such components and ionized process material. The chamber body 106 and lid 104 may be made of metal, such as aluminum. The chamber body 106 may be grounded via a coupling to ground 115.

A substrate support 124 is disposed within the chamber interior volume 120 to support and retain a substrate 122, such as a semiconductor wafer, for example, or other such substrate as may be electrostatically retained. The substrate support 124 may generally comprise an electrostatic chuck 150 (described in more detail below with respect to FIGS. 2-4) and a hollow support shaft 112 for supporting the electrostatic chuck 150. The electrostatic chuck 150 comprises a dielectric plate 152 having one or more electrodes 154 disposed therein and a cooling plate 136. The hollow support shaft 112 provides a conduit to provide, for example, backside gases, process gases, fluids, coolants, power, or the like, to the electrostatic chuck 150.

In some embodiments, the hollow support shaft 112 is coupled to a lift mechanism 113, such as an actuator or motor, which provides vertical movement of the electrostatic chuck 150 between an upper, processing position (as shown in FIG. 1) and a lower, transfer position (not shown). A bellows assembly 110 is disposed about the hollow support shaft 112 and is coupled between the electrostatic chuck 150 and a bottom surface 126 of chamber 100 to provide a flexible seal that allows vertical motion of the electrostatic chuck 150 while preventing loss of vacuum from within the chamber 100. The bellows assembly 110 also includes a lower bellows flange 164 in contact with an o-ring 165 or other suitable sealing element which contacts the bottom surface 126 to help prevent loss of chamber vacuum.

The hollow support shaft 112 provides a conduit for coupling a backside gas supply 141, a chucking power supply 140, and RF sources (e.g., RF plasma power supply 170 and RF bias power supply 117) to the electrostatic chuck 150. In some embodiments, RF energy supplied by the RF plasma power supply 170 may have a frequency of about 40 MHz or greater. The backside gas supply 141 is disposed outside of the chamber body 106 and supplies heat transfer gas to the electrostatic chuck 150. In some embodiments, RF plasma power supply 170 and RF bias power supply 117 are coupled to the electrostatic chuck 150 via respective RF match networks (only RF match network 116 shown). In some embodiments, the substrate support 124 may alternatively include AC, DC, or RF bias power.

A substrate lift 130 can include lift pins 109 mounted on a platform 108 connected to a shaft 111 which is coupled to a second lift mechanism 132 for raising and lowering the substrate lift 130 so that the substrate 122 may be placed on or removed from the electrostatic chuck 150. The electrostatic chuck 150 may include thru-holes to receive the lift pins 109. A bellows assembly 131 is coupled between the substrate lift 130 and bottom surface 126 to provide a flexible seal which maintains the chamber vacuum during vertical motion of the substrate lift 130.

The electrostatic chuck 150 includes gas distribution channels 138 extending from a lower surface of the electrostatic chuck 150 to various openings in an upper surface of the electrostatic chuck 150. The gas distribution channels 138 are in fluid communication with the backside gas supply 141 via gas conduit 142 to control the temperature and/or temperature profile of the electrostatic chuck 150 during use.

The chamber 100 is coupled to and in fluid communication with a vacuum system 114 which includes a throttle valve (not shown) and vacuum pump (not shown) which are used to exhaust the chamber 100. The pressure inside the chamber 100 may be regulated by adjusting the throttle valve and/or vacuum pump. The chamber 100 is also coupled to and in fluid communication with a process gas supply 118 which may supply one or more process gases to the chamber 100 for processing a substrate disposed therein.

In operation, for example, a plasma 102 may be created in the chamber interior volume 120 to perform one or more processes. The plasma 102 may be created by coupling power from a plasma power source (e.g., RF plasma power supply 170) to a process gas via one or more electrodes near or within the chamber interior volume 120 to ignite the process gas and creating the plasma 102. A bias power may also be provided from a bias power supply (e.g., RF bias power supply 117) to the one or more electrodes 154 within the electrostatic chuck 150 to attract ions from the plasma towards the substrate 122.

Figure 2:
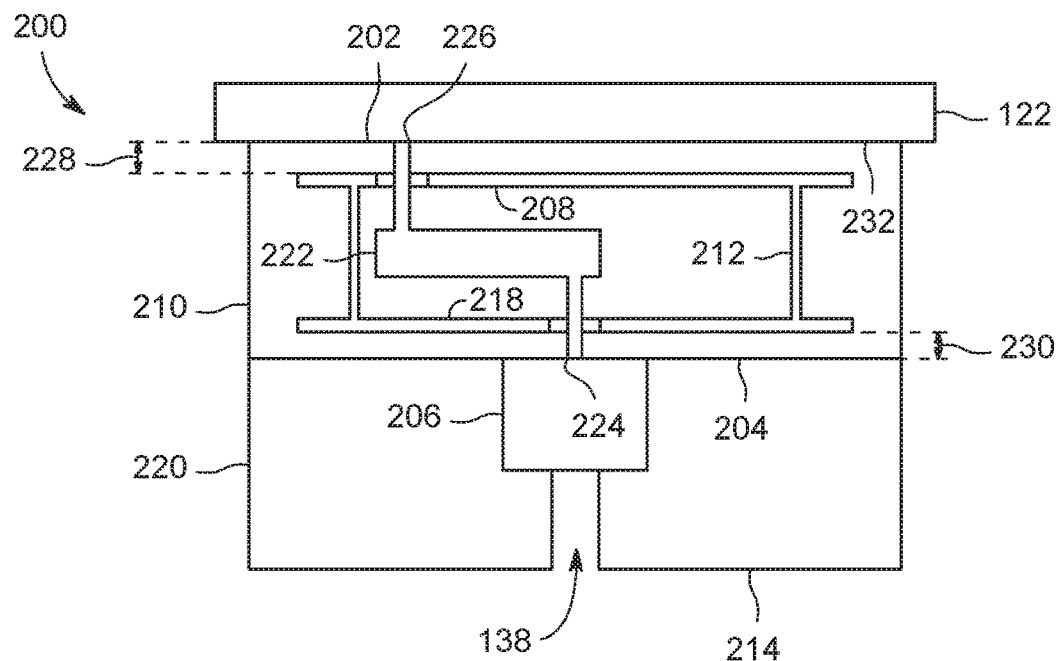
FIG. 2 depicts a schematic partial side view of an electrostatic chuck in accordance with at least some embodiments of the present disclosure.

FIG. 2 depicts a schematic partial side view of an electrostatic chuck 200 for use in the chamber 100 in accordance with at least some embodiments of the present disclosure. The electrostatic chuck 200 may be used as the electrostatic chuck 150 described above with respect to FIG. 1. The electrostatic chuck 200 includes a dielectric plate 210 and a cooling plate 220. In some embodiments, the dielectric plate 210 is attached to the cooling plate 220 using a bond layer. In some embodiments, the dielectric plate 210 has a first side 202 and a second side 204 opposite the first side 202. In some embodiments, the first side 202 corresponds with a support surface 232 of the electrostatic chuck 200. In some embodiments, the substrate 122 is disposed on the support surface 232. In some embodiments, the cooling plate 220 is made of an electrically conductive material, for example, aluminum (Al). In some embodiments, the cooling plate 220 includes passageways (not shown) to accommodate a flow of coolant.

A first electrode 208 is embedded in the dielectric plate 210 proximate the first side 202. A second electrode 218 is embedded in the dielectric plate 210 proximate the second side 204. In some embodiments, the first electrode 208 and the second electrode 218 are substantially parallel. The first electrode 208 and the second electrode 218 may be disk shaped or any other shape corresponding with a shape of the dielectric plate 210. A plurality of conductive elements 212 electrically couple the first electrode 208 to the second electrode 218. In some embodiments, the plurality of conductive elements 212 are a plurality of posts. In some embodiments, a first distance 228 between the first electrode 208 and the first side 202 is about 0.8 mm to about 1.2 mm. In some embodiments, a second distance 230 between the second electrode 218 and the second side 204 is about 0.8 mm to about 1.2 mm. In some embodiments, the first distance 228 is substantially equal to the second distance 230. The first electrode 208, the second electrode 218, and the plurality of conductive elements 212 may be formed of suitable process-compatible materials, such as molybdenum (Mo), titanium (Ti), or the like.

Placing the first electrode 208 close to the first side 202 of the dielectric plate and the second electrode 218 close to the second side 204 with the plurality of conductive elements 212 coupling the first electrode 208 to the second electrode 218 advantageously reduces the potential difference between the support surface 232 and the cooling plate 220 created as RF power goes through the dielectric plate 210. The reduced potential difference advantageously consequently reduces arcing potential in the gas distribution channels 138.

In some embodiments, the gas distribution channels 138 include one or more inlets disposed on a bottom surface of the electrostatic chuck (e.g., bottom surface of the cooling plate). In some embodiments, the gas distribution channels 138 include one or more outlets disposed on the support surface 232, or top surface, of the electrostatic chuck 200. In some embodiments, the gas distribution channels 138 extend from one or more inlets disposed on a bottom surface 214 of the electrostatic chuck 200 to one or more outlets disposed on the top surface of the electrostatic chuck 200. The gas distribution channels 138 are configured to provide backside gas, such as nitrogen (N) or helium (He), to the top surface of the electrostatic chuck.

An area between the first electrode 208 and the second electrode 218 has no electric field. In some embodiments, the gas distribution channels 138 are substantially disposed between the first electrode 208 and the second electrode 218 to advantageously reduce or prevent arcing potential therein. In some embodiments, the gas distribution channels 138 includes a first gas channel 222 disposed within the dielectric plate 210 and between the first electrode 208 and the second electrode 218. The location of the first gas channel 222 between the first electrode 208 and the second electrode 218 advantageously prevents arcing in the first gas channel 222. The first gas channel 222 is coupled to a gas inlet 224 disposed on the second side 204 of the dielectric plate 210. The first gas channel 222 is coupled to a plurality of gas outlets 226 disposed on the first side 202 of the dielectric plate 210. In some embodiments, a cross-sectional width of the first gas channel 222 is about 0.8 mm to about 1.2 mm. In some embodiments, a cross-sectional height of the first gas channel 222 is about 0.8 mm to about 1.2 mm.

In some embodiments, a porous plug 206 is disposed in the gas distribution channels 138 at an interface between the dielectric plate 210 and the cooling plate 220. In some embodiments, the porous plug 206 is made of alumina. The porous plug 206 is configured to reduce or prevent arcing potential of backside gas at the interface between the dielectric plate 210 and the cooling plate 220.

Figure 3:
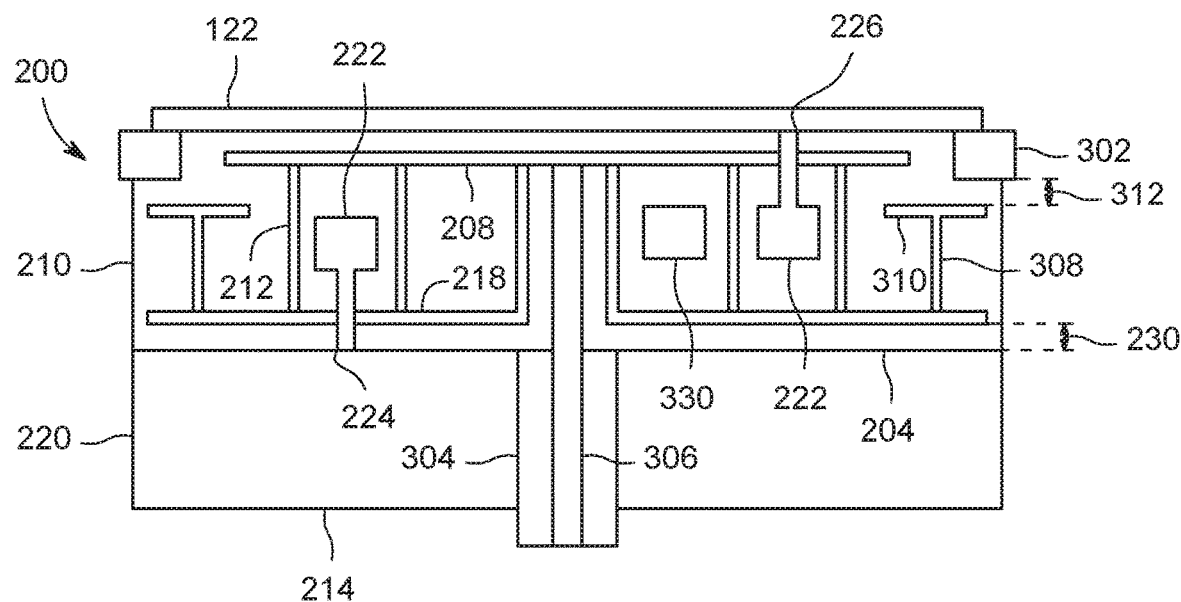
FIG. 3 depicts a schematic side view of an electrostatic chuck in accordance with at least some embodiments of the present disclosure.

FIG. 3 depicts a schematic side view of an electrostatic chuck in accordance with at least some embodiments of the present disclosure. A central connector 306 is coupled to the chucking power supply 140 and extends from the bottom surface 214 of the electrostatic chuck 200 into the dielectric plate 210. In some embodiments, the central connector 306 is directly coupled to the first electrode 208 to couple the chucking power supply 140 to the first electrode 208 to provide chucking power to the first electrode 208. In some embodiments, the central connector 306 is directly coupled to the second electrode 218. In some embodiments, an insulator 304 is disposed about the central connector 306 in the cooling plate 220 to electrically isolate the central connector 306 from the cooling plate 220.

In some embodiments, an edge ring 302 is disposed about the dielectric plate 210 to guide a substrate disposed on the dielectric plate 210. In some embodiments, the edge ring 302 is rests in a notch at an upper peripheral edge of the dielectric plate 210. In some embodiments, the edge ring 302 rests on a quartz ring (not shown) disposed about the cooling plate 220. In some embodiments, the edge ring 302 is disposed about the dielectric plate 210 and the substrate 122. In some embodiments, the edge ring 302 is made of silicon (Si), silicon carbide (SiC), or graphite to reduce contamination on the substrate 122 during processing.

In operation, RF power applied on the cooling plate 220 creates a sheath in between the substrate 122 and the plasma 102. As a result, ions from the plasma 102 are attracted to the substrate 122 that is biased, and the ions accelerate through the sheath perpendicular to equipotential lines within the sheath. When the edge ring 302 is disposed about the dielectric plate 210, the voltage potential on the edge ring is different compared to a voltage potential on the substrate 122. The difference in voltage potential causes the sheath to have a thicker shape above the edge ring 302 than above the substrate 122. As such, the equipotential lines within the sheath do not have a flat profile near an edge of the substrate 122, causing ions accelerate at an angle around the edge ring 302 and leading to an etching profile tilting issue around the edge ring 302.

In some embodiments, a third electrode 310 is embedded in a peripheral region of the dielectric plate 210 and directly coupled to at least one of the first electrode 208 and the second electrode 218 via a plurality of conductive elements 308. In some embodiments, the plurality of conductive elements 308 are a plurality of second posts. The third electrode 310 is disposed vertically between the first electrode 208 and the second electrode 218. In some embodiments, a third distance 312 between the third electrode 310 and a bottom surface of the notch in the upper peripheral edge of the dielectric plate 210 is about 0.8 mm to about 1.2 mm. In some embodiments, the third distance 312 is substantially equal to the first distance 228 and the second distance 230. The third electrode 310 advantageously creates a flatter sheath profile around the edge ring 302 to reduce or prevent the etching profile tilting issue.

Figure 4:
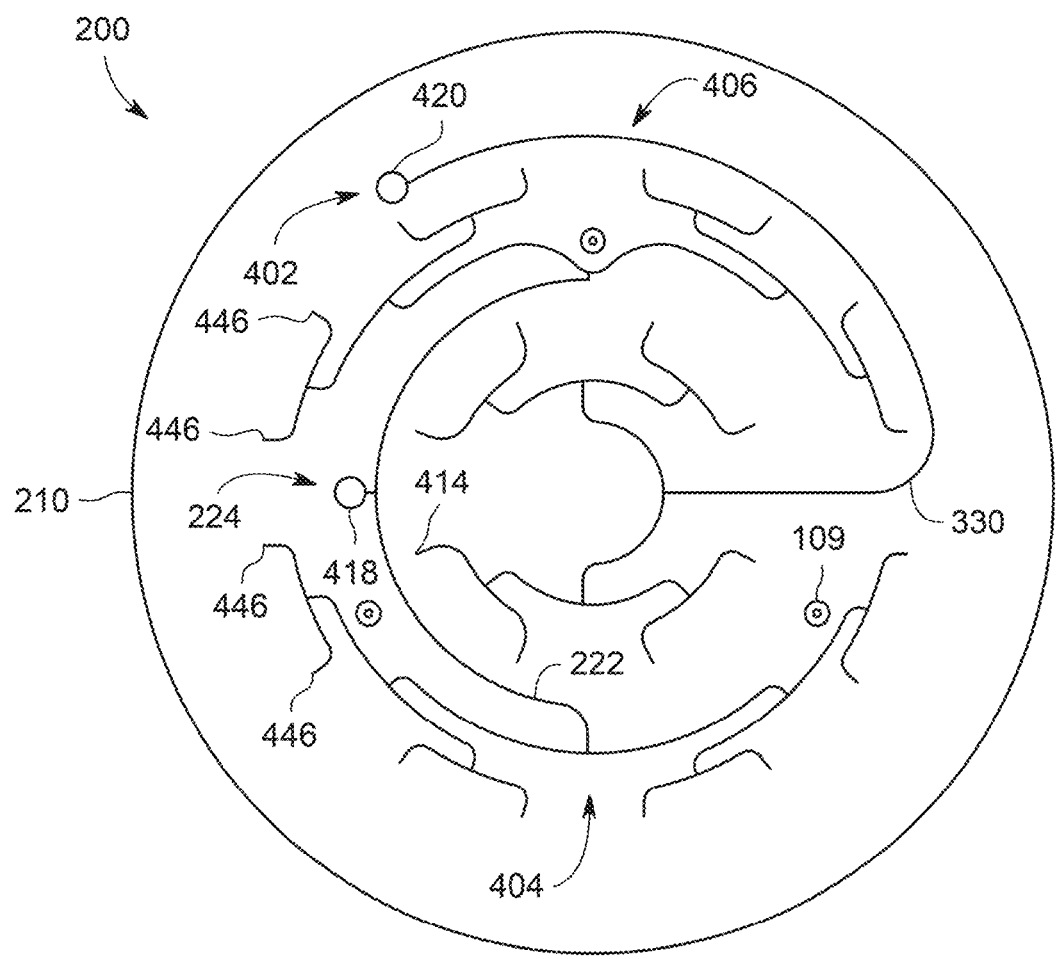
FIG. 4 depicts a cross-sectional top view of an electrostatic chuck in accordance with at least some embodiments of the present disclosure.

FIG. 4 depicts a cross-sectional top view of the electrostatic chuck at a location between the first electrode 208 and the second electrode 218, in accordance with at least some embodiments of the present disclosure. As discussed above, the first gas channel 222 is coupled to a gas inlet 224 disposed on the second side 204 of the dielectric plate 210. The first gas channel 222 includes a first end 418 coupled to the gas inlet 224. In some embodiments, the first gas channel 222 comprises a network of gas channels that extend horizontally across the dielectric plate 210 from the first end 418 to a plurality of second ends 426 to define a first plenum 404. The plurality of second ends 426 are coupled to corresponding ones of the plurality of gas outlets 226. In some embodiments, the network of gas channels are configured to split evenly to provide substantially equal flow length and conductance along each pathway of the first gas channel 222 from the first end 418 to each respective second end 426. Substantially equal conductance means within about ten percent.

In some embodiments, a second gas inlet 402 is disposed on the second side 204 of the dielectric plate 410 and coupled to the second gas channel 330. A plurality of gas outlets are disposed on the first side 202 of the plate and coupled to the second gas channel 330. The second gas channel 330 includes a first end 420 coupled to the second gas inlet 402. In some embodiments, the second gas channel 330 comprises a network of gas channels that extend horizontally across the dielectric plate 210 from the first end 420 to a plurality of second ends 414 to define a second plenum 406. The plurality of second ends 414 are coupled to corresponding ones of the plurality of gas outlets on the first side 202 coupled to the second gas channel 330. In some embodiments, the network of gas channels are configured to split evenly to provide substantially equal flow length and conductance along each pathway of the second gas channel 330 from the first end 420 to each respective second end 414. Substantially equal conductance means within about ten percent.

In some embodiments, the first plenum 404 is fluidly independent from the second plenum 406 within the dielectric plate 210 to advantageously provide greater uniformity or control over the temperature profile of the electrostatic chuck 200. In some embodiments, the plurality of gas outlets 226 coupled to the first gas channel 222 are disposed in a peripheral region of the dielectric plate 210, while the plurality of gas outlets coupled to the second gas channel 330 are disposed in a central region of the dielectric plate 210. In some embodiments, the plurality of gas outlets 226 coupled to the first gas channel 222 are disposed in the central region of the dielectric plate 210, while the plurality of gas outlets coupled to the second gas channel 330 are disposed in the peripheral region of the dielectric plate 210.

In some embodiments, the dielectric plate 210 consists of two plates that are machined to form the first gas channel 222 and the second gas channel 330. In some embodiments, the two plates are sintered. In some embodiments, the two plates are diffusion bonded together once machined.

While the foregoing is directed to embodiments of the present disclosure, other and further embodiments of the disclosure may be devised without departing from the basic scope thereof.

The invention claimed is:

1. An electrostatic chuck for use in a substrate processing chamber, comprising:
   a plate having a first side configured to support a substrate and a second side opposite the first side;
   a first electrode embedded in the plate proximate the first side and configured to chuck the substrate to the first side of the plate;
   a second electrode embedded in the plate proximate the second side, wherein the second electrode extends radially outward of the first electrode;
   a plurality of conductive posts coupling the first electrode to the second electrode;
   a third electrode embedded in a peripheral region of the plate, between the first electrode and the second electrode, wherein the third electrode extends vertically upward from the second electrode via a conductive element, and wherein the third electrode overlaps with the first electrode and the second electrode, and wherein the plate includes a notch at an upper peripheral edge, and wherein a distance between the first electrode and the first side is substantially equal to a distance between the third electrode and a bottom surface of the notch;
   a first gas channel disposed within the plate and between the first electrode and the second electrode;
   a first gas inlet extending from the second side of the plate to the first gas channel; and
   a plurality of first gas outlets extending from the first side of the plate to the first gas channel, wherein the first gas channel comprises a plurality of gas channels that are fluidly connected within the plate and that extend from the first gas inlet horizontally across the electrostatic chuck between the first electrode and the second electrode to a plurality of ends that correspond with the plurality of first gas outlets, wherein at least some of the plurality of gas channels extend in a radial direction such that the first gas inlet is disposed radially inward or radially outward of the plurality of first gas outlets.

2. The electrostatic chuck of claim 1, further comprising a second gas channel disposed within the plate and between the first electrode and the second electrode, a second gas inlet disposed on the second side of the plate and coupled to the second gas channel, and a plurality of second gas outlets disposed on the first side of the plate and coupled to the second gas channel, wherein the second gas inlet is disposed radially inward or radially outward of the plurality of second gas outlets.

3. The electrostatic chuck of claim 1, wherein the first gas inlet is disposed radially inward of the plurality of first gas outlets, and further comprising:
   a second gas inlet extending to a second gas channel disposed within the plate and between the first electrode and the second electrode; and
   a plurality of second gas outlets extending from the second gas channel to the first side of the plate, wherein the plurality of second gas outlets are disposed radially inward of the second gas inlet and the plurality of first gas outlets.

4. The electrostatic chuck of claim 1, wherein the plurality of gas channels are configured to split evenly to provide substantially equal flow length along each pathway of the first gas channel from the first gas inlet to each respective end.

5. The electrostatic chuck of claim 1, wherein a distance from the first electrode to the first side of the electrostatic chuck is substantially equal to a distance from the second electrode to the second side of the electrostatic chuck.

6. An electrostatic chuck for use in a substrate processing chamber, comprising:
   a plate having a first side and a second side opposite the first side;
   a first electrode embedded in the plate proximate the first side;
   a second electrode embedded in the plate proximate the second side, wherein the second electrode extends radially outward of the first electrode;
   a third electrode embedded in a peripheral region of the plate, between the first electrode and the second electrode, wherein the third electrode extends vertically upward from the second electrode via a conductive element; and
   a plurality of first posts extending from the first electrode to the second electrode to electrically couple the first electrode and the second electrode; and
   wherein the third electrode overlaps with the first electrode and the second electrode, and wherein the plate includes a notch at an upper peripheral edge, and wherein a distance between the first electrode and the first side is substantially equal to a distance between the third electrode and a bottom surface of the notch.

7. The electrostatic chuck of claim 6, wherein an outer diameter of the third electrode and an outer diameter of the second electrode are the same.

8. The electrostatic chuck of claim 6, wherein the plate consists of two plates bonded together.

9. The electrostatic chuck of claim 6, wherein a distance between the first electrode and the first side is about 0.8 mm to about 1.2 mm.

10. The electrostatic chuck of claim 6, wherein a distance between the second electrode and the second side is about 0.8 mm to about 1.2 mm.

11. The electrostatic chuck of claim 6, wherein the second electrode extends radially outward of the first electrode.

12. A process chamber, comprising:
a chamber body having a substrate support disposed within an inner volume of the chamber body, wherein the substrate support includes an electrostatic chuck comprising:
a cooling plate;
a dielectric plate disposed above the cooling plate and having a first electrode, a second electrode, and a plurality of posts electrically coupling the first electrode to the second electrode, wherein the first electrode is configured to chuck a substrate to a first side of the dielectric plate;
one or more first gas channels extending from a bottom surface of the electrostatic chuck into the dielectric plate;
a plurality of second gas channels that extend from the one or more first gas channel horizontally across the electrostatic chuck between the first electrode and the second electrode, wherein the plurality of second gas channels are fluidly coupled within the dielectric plate, and wherein a cross-sectional width of the plurality of second gas channels is about 0.8 mm to about 1.2 mm and a cross-sectional height of the plurality of second gas channels is about 0.8 mm to about 1.2 mm;
a plurality of third gas channels extending from the plurality of second gas channels to a top surface of the electrostatic chuck; and
a third electrode embedded in a peripheral region of the dielectric plate between the first electrode and the second electrode, wherein the third electrode extends vertically upward from the second electrode via a conductive element, and wherein the second electrode extends radially outward of the first electrode.

13. The process chamber of claim 12, wherein the electrostatic chuck includes a notch at an upper peripheral edge and an edge ring is disposed in the notch.

14. The process chamber of claim 13, wherein the electrostatic chuck includes a third electrode disposed in a peripheral region of the electrostatic chuck between the first electrode and the second electrode and directly coupled to the second electrode.

15. The process chamber of claim 12, wherein a distance from the first electrode to a top surface of the electrostatic chuck is substantially equal to a distance from the second electrode to a bottom surface of the electrostatic chuck.

16. The process chamber of claim 12, wherein the cooling plate is made of aluminum.

17. The process chamber of claim 12, further comprising a porous plug disposed in the one or more first gas channels at an interface between the dielectric plate and the cooling plate.

* * * * *